United States Patent

Moshtagh

[11] Patent Number: 5,938,851
[45] Date of Patent: Aug. 17, 1999

[54] EXHAUST VENT ASSEMBLY FOR CHEMICAL VAPOR DEPOSITION SYSTEMS

[75] Inventor: Rick S. Moshtagh, San Jose, Calif.

[73] Assignee: WJ Semiconductor Equipment Group, Inc., Scotts Valley, Calif.

[21] Appl. No.: 08/838,882

[22] Filed: Apr. 14, 1997

[51] Int. Cl.[6] ................................................. C23C 16/00
[52] U.S. Cl. ........................... 118/715; 118/725; 118/729
[58] Field of Search ................................... 118/715, 725, 118/729

[56] References Cited

U.S. PATENT DOCUMENTS

| | | | |
|---|---|---|---|
| 4,446,815 | 5/1984 | Kalbskopf | 118/725 |
| 4,834,020 | 5/1989 | Bartholomew | 118/715 |
| 5,413,671 | 5/1995 | Ketchum | 118/715 |
| 5,487,784 | 1/1996 | Ellis | 118/729 |

Primary Examiner—Richard Bueker
Attorney, Agent, or Firm—Flehr Hohbach Test Albritton & Herbert LLP

[57] ABSTRACT

A vent assembly for a chemical vapor deposition system which includes an injector which injects gaseous substances into a reaction chamber for depositing a film on a substrate positioned in the chamber. The vent assembly includes at least one vent having an inlet, an outlet spaced from the inlet and oriented such that the plane of the outlet intersects the inlet, and a passageway joining the inlet and the outlet. The passageway has a linear first stretch substantially axially aligned with the inlet and having a substantially uniform cross-sectional area along the length thereof. The passageway has a nonlinear second stretch joining the first stretch to the outlet. The second stretch is shaped so that changes in direction of the gas flow through the vent are removed from the region of the passageway which is substantially axially aligned with the inlet.

16 Claims, 4 Drawing Sheets

EXHAUST VENT ASSEMBLY FOR CHEMICAL VAPOR DEPOSITION SYSTEMS

BRIEF DESCRIPTION OF THE INVENTION

The present invention relates in general to the removal of unused reagents and reaction by-products during chemical vapor deposition processing and, more particularly, to an exhaust system for a chemical vapor deposition apparatus.

BACKGROUND OF THE INVENTION

Chemical vapor deposition (CVD) systems are used to form a thin, uniform layer or film on a substrate such as a semiconductor wafer. During CVD processing, the substrate is exposed to one or more chemical vapors such as silane, phosphane, diborane and the like, and gaseous substances such as oxygen. The gases mix and interact with the other gases and/or the surface of the substrate to produce the desired film. The desired reactions generally occur at elevated temperatures, for example 300° C. to 500° C., with the substrate and chamber being heated to the appropriate temperature for a selected process. In many applications including semiconductor processing, film characteristics such as purity and thickness uniformity must meet high quality standards.

In general, CVD systems include an injector positioned to inject chemical reagents and other gaseous substances into a clean, isolated reaction chamber. For processing occurring at atmospheric pressure, the substrate may be carried through the chamber on a conveyor or positioned on a stationary support. Vents are positioned on opposite sides of the injector body to remove waste products such as unused reagents and reaction by-products from the reaction chamber. Removing unreacted gases and particulate contamination is necessary to maintain the clean environment of the reaction chamber as well as prevent these materials from being incorporated into the films deposited on the surface of the substrate during processing. The exhaust flows upwardly through the vents and is removed by a reduced pressure exhaust system.

The CVD system typically includes a vent assembly coupled to an exhaust system for removing waste products such as unreacted gases and powders formed during the reaction from the chamber. Removing unreacted gases and particulate contamination is necessary to maintain the clean environment of the reaction chamber as well as prevent these materials from being incorporated into the films deposited on the surface of the substrate during processing. The reaction chamber and vent assembly must be periodically cleaned to eliminate sources of particulate contamination which may become embedded in the film. Typically, cleaning of the vent system may be required as often as every twenty hours of operation to prevent particles from falling on the films during processing, requiring frequent interruption of the CVD process.

As is shown in FIGS. 1A and 1B, the vent assembly which is typically used with elongate, linear injectors include an elongate, vertical vent 1 having a tapered upper end 2 formed with an outlet 3. The outlet 3 is coupled to the low pressure exhaust system for disposal of the waste by-products of the reaction. Although this vent assembly may be used to remove the majority of reaction by-products from the chamber, particles are deposited on the inner surfaces of the vent by the waste materials requiring that the vent assembly be frequently removed and cleaned.

A vent assembly which may be used for extended periods of time without requiring interruption of the CVD process for cleaning, maintenance or replacement is desirable. In addition, a vent assembly which minimizes the risk of particles collecting in the vent assembly and then falling into the reaction chamber is desired. A vent assembly with improved efficiency in delivering particles and unreacted gases from the vent assembly to the exhaust system, minimizing the amount of particulate matter collecting in the vent assembly, is also desirable.

OBJECTS AND SUMMARY OF THE INVENTION

It is a primary object of the present invention to provide a vent assembly for a CVD processing system for removing unreacted gases and particulate contamination from the reaction chamber.

It is a further object of the present invention to provide a vent assembly which inhibits the collection or formation of particles within the vent assembly.

It is another object of the present invention to provide a vent assembly which inhibits or restricts the transfer of particles from the vent assembly into the chamber.

It is yet another object of the present invention to provide a vent assembly which provides a substantially constant velocity of exhaust gas from the reaction chamber.

A more general object of the present invention is to provide a vent assembly which may be used for an extended period of time without requiring cleaning or replacement, reducing the maintenance costs and maximizing the operational time of the CVD system, and which may be economically and efficiently manufactured and maintained.

In summary, this invention provides a vent assembly which may be used in CVD systems to minimize the amount of unreacted gases and particulate contamination in the reaction chamber. The vent assembly includes at least one exhaust vent for removing unused gaseous substances and reaction by products from the reaction chamber. The exhaust vent includes an inlet positioned to collect unused gaseous substances and reaction by-products from the reaction chamber. A first passageway is substantially axially aligned with inlet, and has a substantially uniform cross-sectional area along the length of the passageway. An outlet is spaced from the first passageway and joined to the first passageway by a second passageway. The outlet is oriented such that the plane of the outlet intersects the first passageway, and the second passageway is offset from the axis of the inlet such that changes in flow direction are removed from the region of the vent which is directly above the inlet.

Additional objects and features of the invention will be more readily apparent from the following detailed description and appended claims when taken in conjunction with the drawings.

DETAILED DESCRIPTION OF THE INVENTION

Figure 1A:
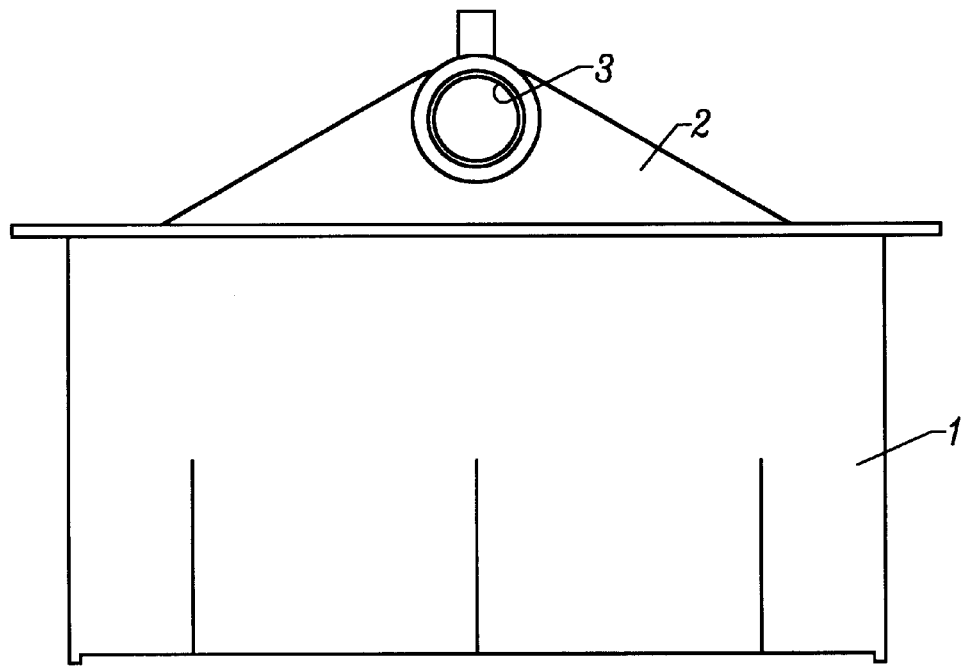
FIG. 1A is a front plan view of an existing vent assembly.
Figure 1B:
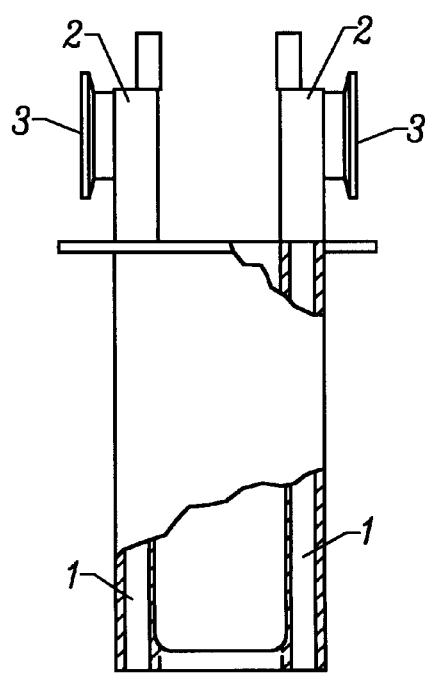
FIG. 1B is an end view of the vent assembly of FIG. 1A.

Reference will now be made in detail to the preferred embodiment of the invention, which is illustrated in the accompanying figures. Turning now to the drawings, wherein like components are designated by like reference numerals throughout the various figures, attention is directed to FIG. 2.

Figure 2:
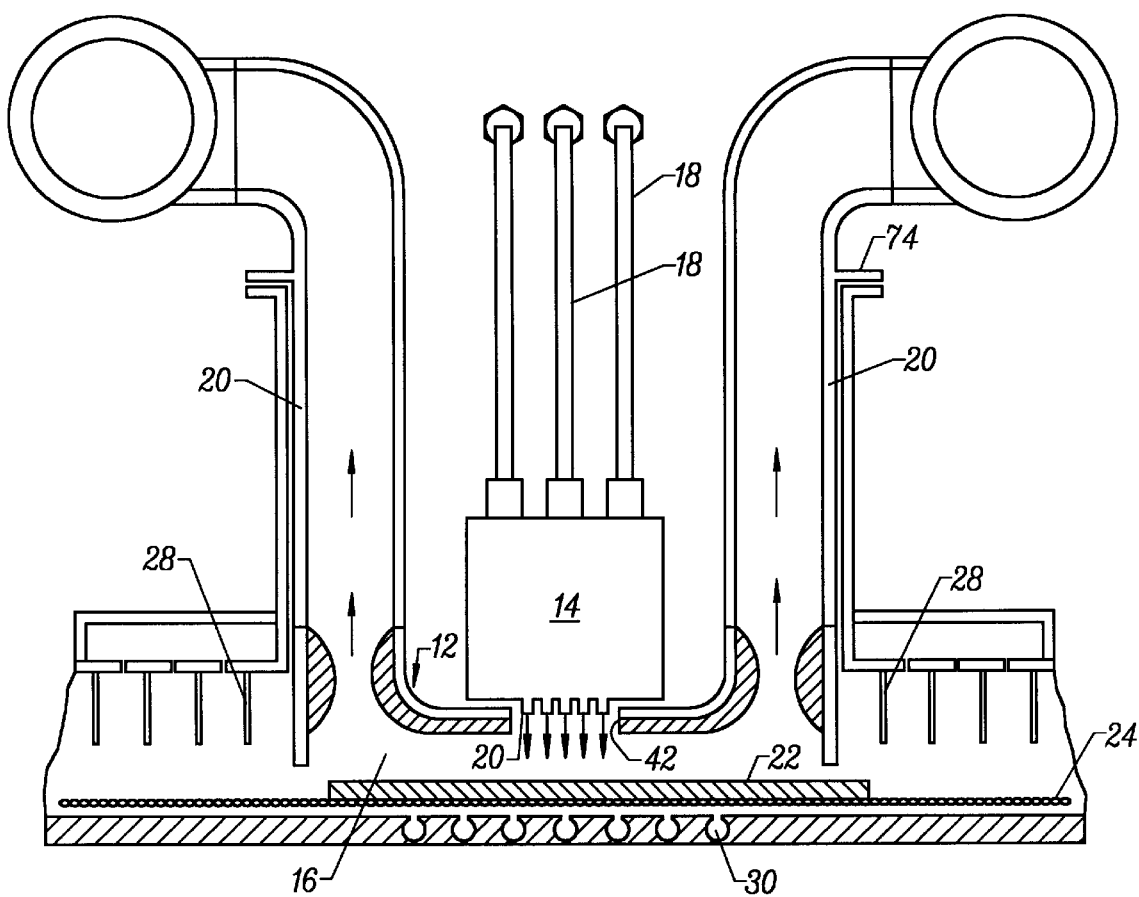
FIG. 2 is a schematic view of a CVD processing system with a vent assembly in accordance with the present invention.

FIG. 2 schematically illustrates a section of a CVD processing system 10 which includes a vent assembly 12 constructed in accordance with this invention. As is known in the art, a CVD system typically includes an injector 14 for injecting chemical reagents and other gaseous substances into a chamber, generally designated 16. Conduits 18 deliver the gaseous substances to the injector 14, which transports the gases through separate flow paths to one of the injection ports 20. Although not shown, each port 20 extends lengthwise along the longitudinal axis of the injector 14 to deliver the gaseous substance in a sheet-like flow to the reaction chamber 16. As a semiconductor wafer 22 or other substrate is transported through the chamber 16 by a conveyor 24, the injected substances react with each other and/or with the upper surface of the wafer 22 to form a thin, uniform layer or film. The actual reagents used in the CVD process depends in part upon the type and quality of film desired.

In one application of the processing system 10, the inner port 20 is coupled via injector 14 and one conduit 18 to a silicon source reactant such as silicon, silane or disilane, nitrogen, and if desired a dopant source reactant such as TMP, TMB, phosphine and/or diborane. Oxygen or a combination of oxygen and ozone and nitrogen is delivered through another conduit 18 and the injector to the outer ports 20. A stream of pure nitrogen travels through another conduit 18 to the intermediate ports 20 to separate the silicon source reactant from the oxygen mixture until the gases approach the wafer surface. Deposition waste products including unreacted gas are expelled through the vent assembly 10 which is coupled to a suitable exhaust system (not shown). Curtains 28 substantially isolate the chamber 16 from areas of the CVD assembly upstream and downstream of chamber 16. The chamber 16 and wafer 22 are retained at the desired reaction temperature by heating elements 30.

Figure 3:
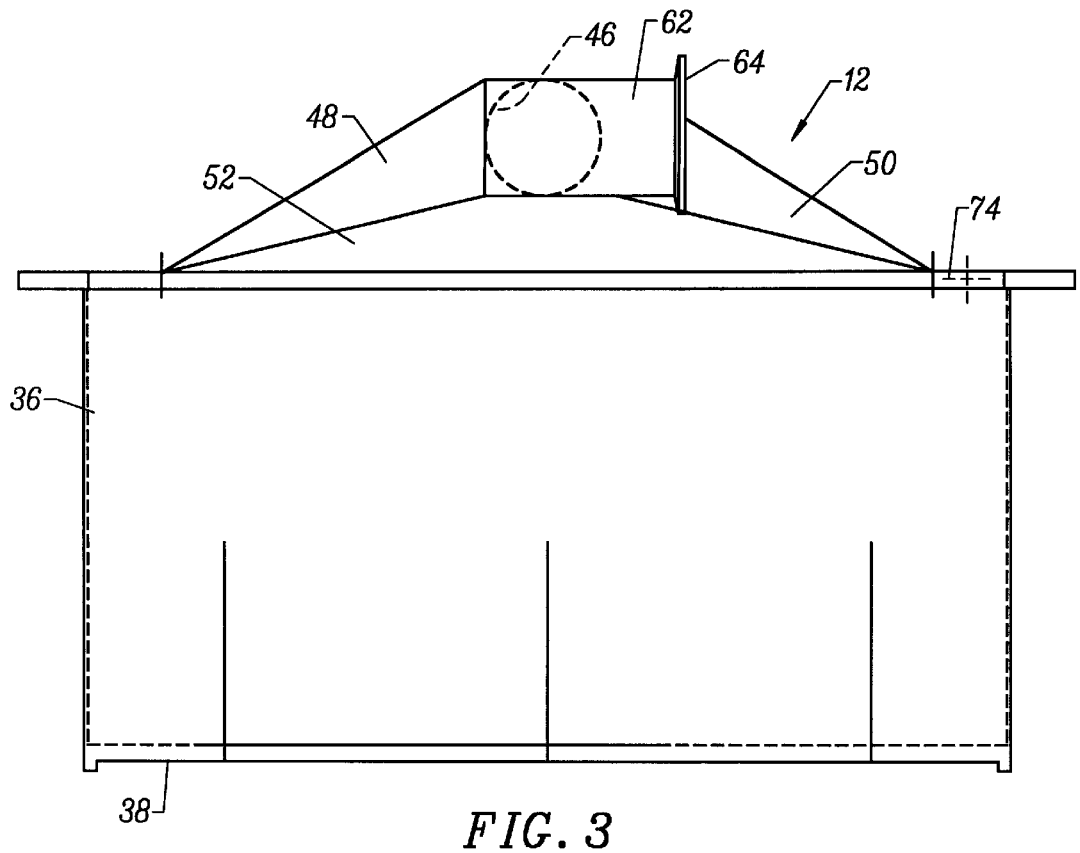
FIG. 3 is a front plan view of a vent assembly in accordance with this invention.
Figure 4:
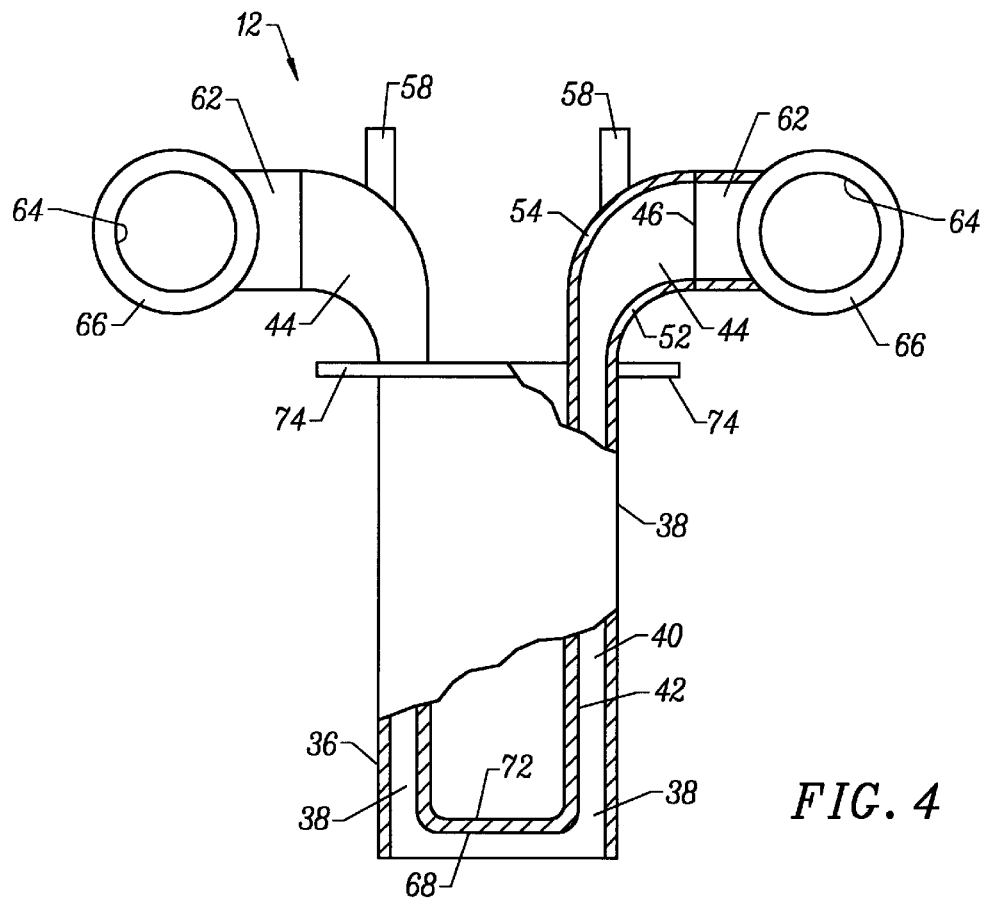
FIG. 4 is an end view, partially broken away, of the vent assembly of FIG. 3.
Figure 5:
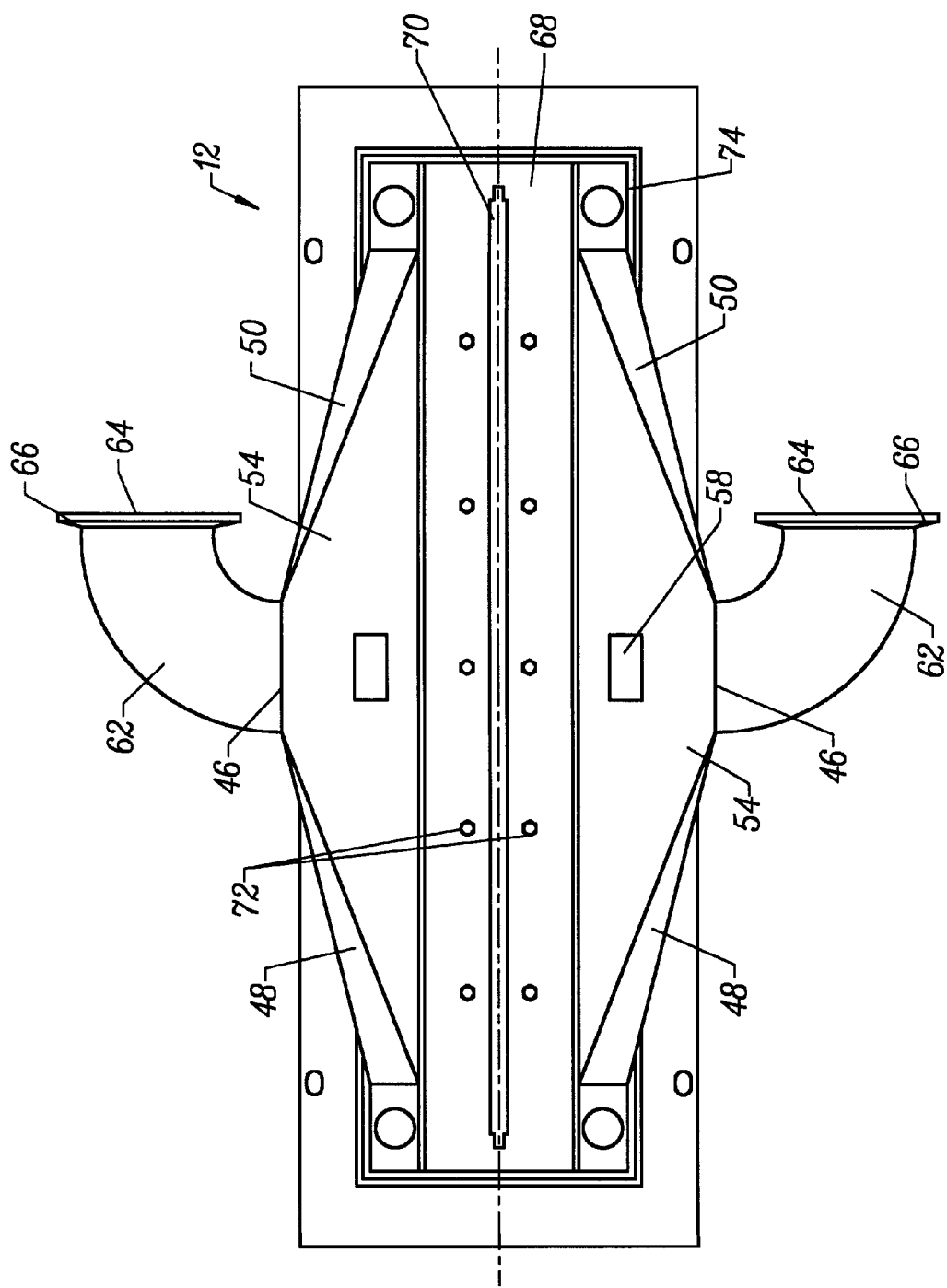
FIG. 5 is a top plan view of the vent assembly of FIG. 3.

The vent assembly 12 of this invention is described in greater detail in relation to FIGS. 3–5. In the illustrated embodiment, vent assembly 12 includes a pair of vents 36 positioned on opposite sides of the injector. Each vent 36 includes an inlet 38 for drawing gaseous substances and reaction by-products into the vent assembly to remove waste products from the reaction chamber 16. The inlet 38 is preferably of sufficient length to border the reaction area beneath the injector 14, ensuring the reaction by-products will be efficiently and uniformly removed from the chamber 16. In the illustrated modification, the inlet 38 extends at least along the length of the ports 20, although it is to be understood that the length of the inlet 38 may be increased or decreased if desired. The width of the inlet opening is selected to provide a uniform, steady flow of gas from the reaction chamber into the vent assembly 12. The vent assembly 12 of the illustrated embodiment preferably has a width in the range of 4.5 to 5 inches, for example 4.84 inches.

A first passageway 40 extends upwardly from the inlet 38. As is shown particularly in FIG. 4, the passageway 40 includes a major portion 42 which is substantially aligned with the vertical axis of the inlet 38. The passageway 40 includes an outwardly curved stretch 44 extending upwardly and outwardly from the major portion 40. The curved stretch 44 terminates in a port or aperture 46. With the vent assembly of this invention, the first passageway 40 has a substantially uniform cross-sectional area at least in the region which is axially aligned with the vent 38. The major portion 42 is in the form of a rectangular passageway of substantially uniform width and length. In the illustrated embodiment, the major portion 42 has a width on the order of 0.8 to 0.9 inches, for example 0.88 inches, and a length on the order of 18.5 to 19.5 inches, for example 18.89 inches. In the curved stretch 44, the spaced edge walls 48 and 50 are tapered inwardly from the major portion 42 toward the of the port 46. As the length of the passageway 40 between the walls 48 and 50 decreases, the width of the passageway between walls 52 and 54 increases as is shown particularly in FIGS. 3 and 4. The cross-sectional area of the first passageway 40 is substantially constant from the inlet 38 to the port 46.

As is shown particularly in FIG. 4, the cross-sectional area of the first passageway is substantially constant in the region directly above the inlet 38 to maintain a substantially constant velocity of gas through the inlet and into the vent assembly. Maintaining a uniform flow of gas is of particular advantage in that it minimizes the formation of deposits on the inner walls of the major portion 42 of the passageway 40. Minimizing film deposition in the region which is vertically aligned with the inlet is particularly important, where particles from the deposited film could fall onto the wafer 22 traveling below the inlet 38.

A second passageway 62 extends outwardly from the port 46 to an outlet 64. A flange 66 surrounds the outlet 64 for mounting the vent assembly 12 to an exhaust system (not shown). As is shown particularly in FIG. 5, the second passageway 62 is provided by a channel having an inner radius of curvature of about 1.0 to 1.5, for example 1.25, and an outer radius of curvature of about 3.5 to 4.0, for example 3.75. Thus, the axis of the passageway 62 has a radius of curvature of about 2.25 to 2.75, for example 2.5. This curvature ensures the second passageway 62 is a smooth gas flow path from the port 46 to the outlet 64. The outlet is spaced outwardly of the inlet 38 and port 46, and the plane of the outlet 64 is oriented at an angle relative to the plane of the port 46 of about 88° to 92°, for example 90°. With this configuration, significant directional changes in the flow path are removed from the first passageway 40 and the region directly about the vent, reducing the accumulation of material on the walls of the first passageway 40 which could lead to particle formation and the introduction of particulate contamination to the reactor chamber 16. The degree of the directional changes is also reduced, providing a smoother flow path and reducing the amount of deposition on the interior surfaces of the vent over time. By substantially reducing the amount of film deposited on the inner walls of the first passageway 40, the number of interruptions in processing required for cleaning and maintenance of the vent assembly 12 drops considerably, improving the processing efficiency. Minimizing the development of particles in the major portion 42 of the passageway 40 also improves film quality by removing a potential source of particulate contamination.

The cross-sectional area of the second passageway 62 and outlet 64 is approximately equal to the size of the port 46 to provide for a substantially uniform gas flow to the exhaust system (not shown). In this embodiment of the invention, the port 46, second passageway 62 and outlet 64 have an interior diameter of about 2 to 3 inches, for example 2.5 inches. However, it is to be understood that the area may be increased or decreased within the scope of this invention.

As is shown particularly in FIGS. 4 and 5, in this embodiment of the invention the two vents 36 are connected by a base plate 68 which extends between the vents 36 adjacent inlets 38. The vent assembly may include hooks, carrino lugs, or other members 58 which may be used to facilitate removal of the assembly for cleaning and maintenance. When the vent assembly 12 is installed in the CVD system, the injector body 14 is positioned between the vents and mounted to base plate 68. As is shown particularly in FIG. 5, the plate 68 is formed with a longitudinally extending slot 70 which corresponds to the configuration of the ports 20 of the injector body 14. The injector body 14 is mounted to the plate 68 with fasteners (not shown) which are inserted through several or all of the apertures 72 formed in the plate. An upper flange 74 extending outwardly from the vents 36 is used to mount the vent assembly to the housing of the CVD system as is shown schematically in FIG. 2. It is to be understood that, instead of plate 68 and flange 74, the vent assembly 12 may include other means for installing the vent assembly 12.

As is apparent from the foregoing description, the vent assembly 12 of the present invention provides a means for removing unused gases and reaction by-products from the reaction chamber over an extended period of time. The constant cross-sectional area of the first passageway 40 maintains a uniform gas velocity through the first passageway and reduces the amount of deposition on the inner walls of the passageway. The position of the outlet 64 relative to the inlet 38 and port 46 removes significant directional changes in flow away from the region of the vent directly above the inlet 38, reducing the amount of deposition, and potential source of particulate contamination, on the walls of the first passageway 40. The vent assembly 12 of this invention may be used for extended periods of time between cleanings, reducing maintenance costs and maximizing the operational time and efficiency of the CVD system.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A chemical vapor deposition system for depositing a film on a substrate positioned in a reaction chamber comprising:
    an injector body having a front surface formed with ports for injecting gaseous substances into the reaction chamber and side surfaces extending from said front surface toward a back surface spaced from said front surface; and
    a vent assembly for removing unused gaseous substances and reaction by-products from the reaction chamber, said vent assembly including at least one vent having an inlet positioned to collect unused gaseous substances and reaction by-products from the reaction chamber, a first passageway substantially axially aligned with said inlet, an outlet positioned downstream of said first passageway, and a second passageway between said outlet and said first passageway, said first passageway having a substantially uniform cross-sectional area along the length thereof, wherein said second passageway is a curved passageway having an axis having a radius of curvature in the range of 2.25 to 2.75.

2. The chemical vapor deposition system of claim 1 in which said vent is positioned adjacent one of said side surfaces of said injector body, and in which said vent assembly includes a second vent positioned adjacent another of said side surfaces of said injector body.

3. The chemical vapor deposition system of claim 1 in which said vent assembly is mounted to said injector body.

4. The chemical vapor deposition system of claim 1 in which said outlet is oriented such that the plane of said outlet intersects said first passageway, and said second passageway is offset from the axis of said inlet such that changes in flow direction are removed from the region of said vent which is substantially aligned with said inlet.

5. The chemical vapor deposition system of claim 1 in which said second passageway is a curved passageway having an axis having a radius of curvature in the range of 2.25 to 2.75.

6. The chemical vapor deposition system of claim 1 in which said injector body is formed with linear ports, and in which said inlet of said exhaust vent extends along the length of said linear ports.

7. A chemical vapor deposition system for depositing a film on a substrate positioned in a reaction chamber comprising:
    an injector body having a front surface formed with ports for injecting gaseous substances into the reaction chamber and side surfaces extending from said front surface toward a back surface spaced from said front surface; and
    a vent assembly for removing unused gaseous substances and reaction by-products from the reaction chamber, said vent assembly including at least one vent having an inlet positioned to collect unused gaseous substances and reaction by-products from the reaction chamber, a first passageway substantially axially aligned with said inlet, an outlet spaced from said first passageway and oriented such that the plane of said outlet intersects said first passageway, and a second passageway between said outlet and said first passageway, said second passageway being offset from the axis of said inlet such that changes in flow direction are removed from the region of said first passageway which is substantially aligned with said inlet.

8. The chemical vapor deposition system of claim 7 in which said vent is positioned adjacent one of said side surfaces of said injector body, and in which said vent assembly includes a second vent positioned adjacent another of said side surfaces of said injector body.

9. The chemical vapor deposition system of claim 7 in which said vent is mounted to said injector body.

10. The chemical vapor deposition system of claim 7 in which said first passageway has a substantially uniform cross-sectional area along the length thereof.

11. The chemical vapor deposition system of claim 7 in which said second passageway is a curved passageway having an axis having a radius of curvature in the range of 2.25 to 2.75.

12. The chemical vapor deposition system of claim 7 in which said injector body is formed with linear ports, and in which said inlet of said exhaust vent extends along the length of said linear ports.

13. A vent assembly for a chemical vapor deposition system including an injector body having a front surface formed with ports for injecting gaseous substances into a reaction chamber and side surfaces extending from the front surface toward a back surface spaced from the front surface; said exhaust system comprising:

at least one vent for removing unused gaseous substances and reaction by-products from the reaction chamber, said vent having an inlet, an outlet spaced from said inlet and oriented such that the plane of said outlet intersects said inlet, and a passageway joining said inlet and said outlet, said passageway having a linear first stretch substantially axially aligned with said inlet, said first stretch having a substantially uniform cross-sectional area along the length of said first stretch, said passageway having a nonlinear second stretch joining said first stretch to said outlet, said second stretch being shaped so that changes in direction of the gas flow through said vent are removed from the region of said passageway which is substantially axially aligned with said inlet.

14. The vent assembly of claim 13, and further comprising a second vent.

15. The vent assembly of claim 13 in which said second stretch includes is curved section having an axis having a radius of curvature in the range of 2.25 to 2.75.

16. In combination, the exhaust assembly of claim 13 and an injector body having a front surface formed with ports for injecting gaseous substances into a reaction chamber and side surfaces extending from the front surface toward a back surface spaced from said front surface, said vent being positioned adjacent one of said side surfaces of said injector body.

* * * * *